(12) United States Patent
Nguyen et al.

(10) Patent No.: US 11,719,880 B2
(45) Date of Patent: Aug. 8, 2023

(54) PEROVSKITE OPTICAL ELEMENT AND MANUFACTURING METHOD THEREOF

(71) Applicant: NATIONAL DONG HWA UNIVERSITY, Hualien County (TW)

(72) Inventors: Duc-Huy Nguyen, Hualien (TW); Jia-Yuan Sun, Hualien (TW); Chia-Yao Lo, Hualien (TW); Jia-Ming Liu, Hualien (TW); Wan-Shao Tsai, Hualien (TW); Ming-Hung Li, Hualien (TW); Sin-Jhang Yang, Hualien (TW); Cheng-Chia Lin, Hualien (TW); Shien-Der Tzeng, Hualien (TW); Yuan-Ron Ma, Hualien (TW); Ming-Yi Lin, Hualien (TW); Chien-Chih Lai, Hualien (TW)

(73) Assignee: NATIONAL DONG HWA UNIVERSITY, Hualien County (TW)

( * ) Notice: Subject to any disclaimer, the term of this patent is extended or adjusted under 35 U.S.C. 154(b) by 0 days.

(21) Appl. No.: 17/547,434

(22) Filed: Dec. 10, 2021

(65) Prior Publication Data

US 2023/0118309 A1    Apr. 20, 2023

(30) Foreign Application Priority Data

Oct. 14, 2021    (TW) .................. 110138191

(51) Int. Cl.
*G02B 6/02*    (2006.01)
*C03C 25/105*    (2018.01)
(Continued)

(52) U.S. Cl.
CPC ........ *G02B 6/02395* (2013.01); *C03C 25/105* (2013.01); *C03C 25/328* (2013.01);
(Continued)

(58) Field of Classification Search
CPC ... G02B 6/02395; C03C 25/47; C03C 25/105; C03C 25/328; C03C 25/42; C03C 2218/111
See application file for complete search history.

(56) References Cited

U.S. PATENT DOCUMENTS 7,279,237 B2 * 10/2007 Thompson .......... H01L 51/5221
                                                    428/917
7,563,519 B2 *  7/2009 Thompson ............. H05B 33/14
                                                    428/917
(Continued)

FOREIGN PATENT DOCUMENTS

CN    106558650 A  *  4/2017
CN    106848076 A     6/2017
(Continued)

OTHER PUBLICATIONS

Sedov, E., Sedova, I., Arakelian, S. et al. Hybrid optical fiber for light-induced superconductivity. Sci Rep 10, 8131 (2020). https://doi.org/10.1038/s41598-020-64970-w (Year: 2020).*
(Continued)

*Primary Examiner* — Peter Radkowski
(74) *Attorney, Agent, or Firm* — Alan D. Kamrath; Karin L. Williams; Mayer & Williams PC

(57) ABSTRACT

A perovskite optical element includes a light guiding unit and a luminescent layer. The light guiding unit is configured to conduct light and serves as a resonant cavity. The luminescent layer is a thin film made of perovskite material and clads the light guiding unit. The luminescent layer is configured to be excited by an excitation module to emit light. The light is conducted and output by the light guiding unit. A manufacturing method of a perovskite optical element includes preparing a dip coating solution; dipping a single crystal optical fiber in the dip coating solution for one hour, removing the single crystal optical fiber out of the dip (Continued)

coating solution, and drying the single crystal optical fiber; and placing the single crystal optical fiber into a tube furnace, heating the crystal optical fiber, and introducing synthetic molecules into the tube furnace.

4 Claims, 4 Drawing Sheets

(51) Int. Cl.
    *C03C 25/328*     (2018.01)
    *C03C 25/42*     (2006.01)
    *C03C 25/47*     (2018.01)

(52) U.S. Cl.
    CPC .............. *C03C 25/42* (2013.01); *C03C 25/47* (2018.01); *C03C 2218/111* (2013.01)

(56) References Cited

U.S. PATENT DOCUMENTS

| | | | |
|---|---|---|---|
| 2005/0214570 A1* | 9/2005 | Thompson | H01L 51/0084 428/917 |
| 2006/0286409 A1* | 12/2006 | Thompson | C07D 487/22 428/917 |
| 2021/0210707 A1 | 7/2021 | Levermore | |

FOREIGN PATENT DOCUMENTS

| | | |
|---|---|---|
| CN | 112313815 A | 2/2021 |
| CN | 113113834 A | 7/2021 |

OTHER PUBLICATIONS

Du et al., Optical properties of ultrathin aluminum films deposited by magnetron sputtering in visible band, Optical Materials 28 (2006) 944-949 (Year: 2006).*

Wang et al., "Silica cladded Nd3+:YAG single crystal core optical fiber and its submicron residual stress detection," Opt. Mater. Express 4, 656-661 (2014) (Year: 2014).*

C. Larsen, K. P. Hansen, K. E. Mattsson, and O. Bang, "The all-fiber cladding-pumped Yb-doped gain-switched laser," Opt. Express 22, 1490-1499 (2014) (Year: 2014).*

Heinze et al. Importance of methylammonium iodide partial pressure and evaporation onset for the growth of co-evaporated methylammonium lead iodide absorbers. Sci Rep. Jul. 27, 2021;11(1):15299. doi: 10.1038/s41598-021-94689-1. PMID: 34315927; PMCID: PMC8316399. Published Jul. 21, 2021 (Year: 2021).*

Lee et al., Transamidation of dimethylformamide during alkylammonium lead triiodide film formation for perovskite solar cells, J. Mater. Res., vol. 32, No. 1, Jan. 13, 2017 (Year: 2017).*

Shaw et al., "Cladding Pumped Single Crystal Yb:YAG Fiber Amplifier," in Advanced Solid State Lasers, OSA Technical Digest (online) (Optica Publishing Group, 2015), paper AM4A.4. (Year: 2015).*

* cited by examiner

PEROVSKITE OPTICAL ELEMENT AND MANUFACTURING METHOD THEREOF

CROSS REFERENCE TO RELATED APPLICATION

The application claims the benefit of Taiwan application serial No. 110138191, filed on Oct. 14, 2021, and the entire contents of which are incorporated herein by reference.

BACKGROUND OF THE INVENTION

1. Field of the Invention

The present invention relates to a photoelectrical material and, more particularly, to a perovskite optical element operable at the room temperature and having a stable output as well as a manufacturing method thereof.

2. Description of the Related Art

Perovskite is a compound having the general formula $ABX_3$, wherein A is a cation, B is a metal ion, and X is a halogen anion. A perovskite thin film made of metal halide perovskite, such as methylammonium lead iodide ($CH_3NH_3PbI_3$, $MAPbI_3$), has photoluminescence characteristics of high optical energy conversion efficiency and a low threshold and, thus, can be used as a photovoltaic material or a luminous element, which can be applied in techniques including solar energy generation, laser, light-emitting diodes, etc. Adjusting the ratio of the halide in the perovskite thin film can emit light in different wavelength ranges for use in light sources of energy-saving semiconductor illuminating devices and integrated optical circuits.

The conventional perovskite thin film deteriorates when comes in contact with water and oxygen in the environment, resulting in shortening of the service life. Furthermore, perovskite material has a poor cooing effect and is not resistant to high temperature, such that the conventional perovskite thin film must be used in a working environment without water and oxygen and at a low temperature. An optical element produced from the conventional perovskite thin film cannot be operated at the room temperature and non-sealed conditions. Thus, the perovskite thin film cannot be used in technical fields including illumination, optical chips, etc. Furthermore, the interaction mechanism of the perovskite material is complicated, such that the manufacturing procedures and subsequent treatments of the conventional perovskite material are complicated, increasing the costs for production and maintenance.

Thus, it is necessary to improve the conventional perovskite thin film and the manufacturing method thereof.

SUMMARY OF THE INVENTION

To solve the above problems, it is an objective of the present invention to provide a perovskite optical element that can operate to emit light at room temperature.

It is another objective of the present invention to provide a perovskite optical element that can output light of multiple wavelengths.

It is a further objective of the present invention to provide a perovskite optical element capable of reducing volume and reducing energy consumption.

It is still another objective of the present invention to provide a perovskite optical element capable of reducing manufacturing difficulties of elements.

When the terms "inner", "outer", "side", and similar terms are used herein, it should be understood that these terms have reference only to the structure shown in the drawings as it would appear to a person viewing the drawings and are utilized only to facilitate describing the invention, rather than restricting the invention.

As used herein, the term "a", "an" or "one" for describing the number of the elements and members of the present invention is used for convenience, provides the general meaning of the scope of the present invention, and should be interpreted to include one or at least one. Furthermore, unless explicitly indicated otherwise, the concept of a single component also includes the case of plural components.

A perovskite optical element according to the present invention includes a light guiding unit and a luminescent layer. The light guiding unit is configured to conduct light and serves as a resonant cavity. The luminescent layer is a thin film made of perovskite material and clads the light guiding unit. The luminescent layer is configured to be excited by an excitation module to emit light. The light is conducted and output by the light guiding unit.

A manufacturing method of a perovskite optical element according to the present invention includes preparing a dip coating solution; dipping a single crystal optical fiber in the dip coating solution for one hour, removing the single crystal optical fiber out of the dip coating solution, and drying the single crystal optical fiber; and placing the single crystal optical fiber into a tube furnace, heating the crystal optical fiber, and introducing synthetic molecules into the tube furnace.

Thus, in the perovskite optical element and the manufacturing method thereof according to the present invention, due to the characteristics of high thermal conductivity, photo conduction, and micro resonant cavity of the light guiding unit as well as the characteristics of the high luminescence efficiency and adjustable light wavelength of luminescent layer, the optical element produced can operate at normal temperature and can provide light of all bands. Furthermore, the perovskite optical element has a small volume and can be optionally and simply driven by electricity or light, thereby reducing the manufacturing complexity, reducing the consumed energy for driving, and being suitable for application in optical chips.

In an example, the light guiding unit is a column structure of a section of a single crystal optical fiber. The luminescent layer dads an outer periphery of the light guiding unit. The cross section of each of two ends of the light guiding unit is configured to connect with a light source or to output the light. Thus, the area of the light guiding unit cladded by the luminescent layer can be maximized, providing rapid cooling and increasing the light conduction efficiency.

In an example, the perovskite material of the luminescent layer is methylammonium lead iodide. Thus, the luminescent layer can receive low-energy excitation to emit light, and light of different wavelengths can be produced by adjusting the ratio of the halide thereof, thereby reducing the driving energy and providing output of multiple wavelengths.

In an example, the perovskite optical element further includes a protective layer covering an outer surface of the luminescent layer. Thus, the protective layer can prevent water and oxygen in the environment from directly contacting with the luminescent layer, increasing the service life of the optical element.

In an example, the excitation module is a pulse laser which emits a laser light entering the luminescent layer at an arbitrary angle. Thus, the excitation module may be located on a side of the light guiding unit to save the installation space for the excitation module, reducing the volume of the light-emitting device.

In an example, the excitation module is a voltage source having an anode and a cathode. The anode and the cathode are in electrical connection with the luminescent layer. Thus, the excitation module can create a magnetic field at the luminescent layer, providing an electroluminescence effect.

In an example, the dip coating solution is obtained from dissolving lead iodide in dimethylformamide. Lead iodide crystals are formed on an outer surface of the single crystal optical fiber. The synthetic molecules are methylammonium iodide. The lead iodide crystals on the single crystal optical fiber synthesize with the synthetic molecules after heating, forming a thin film of methylammonium lead iodide. Thus, the ratio of lead iodide can be adjusted to form a uniform thin film of methylammonium lead iodide, increasing the luminescence efficiency and providing output of multiple wavelengths.

In an example, two ends of the tube furnace are sealed and an intermediate portion of the tube furnace is heated. An inert gas and the synthetic molecules are introduced into an interior space of the tube furnace. Thus, the temperature and pressure in the tube furnace can be adjusted, increasing the stability of the synthetic reaction.

In an example, after the single crystal optical fiber is placed into the tube furnace, the tube furnace is evacuated to a pressure range of 0.01-5 Torr. The tube furnace is then gradually heated to a temperature range of 100-130° C. The inert gas is filled into the tube furnace simultaneously to increase the pressure to 5-20 Torr. The synthetic molecules are added to proceed with a reaction. During the reaction, the tube furnace is maintained at the temperature range of 100-130° C. and the pressure range of 0.01-5 Torr for 1-5 hours. Thus, the synthetic molecules can proceed with reaction in a sealed, stable environment, avoiding mixing of alien objects and increasing the quality of the perovskite material.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

DETAILED DESCRIPTION OF THE INVENTION

Figure 1:
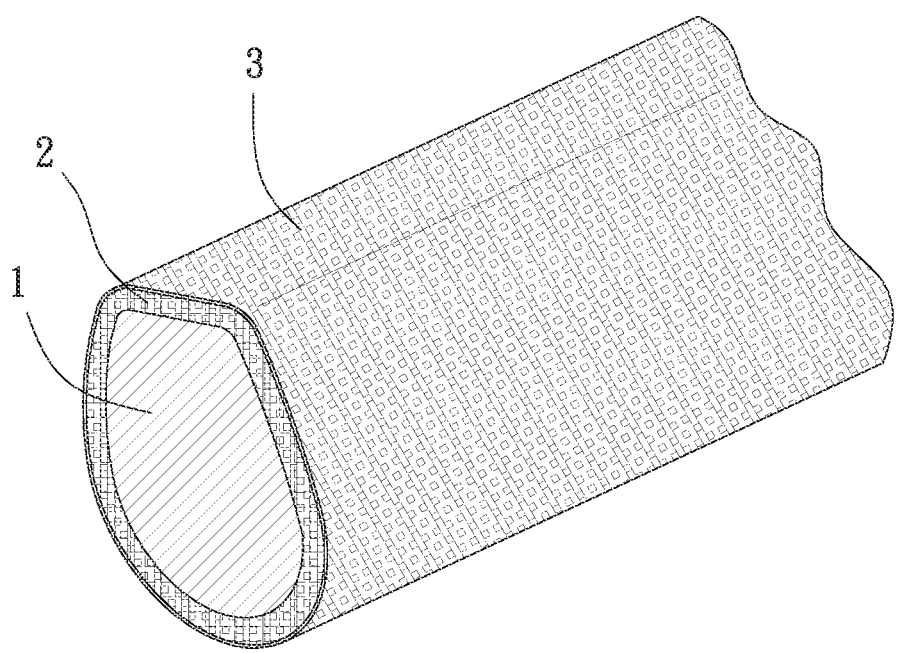
FIG. 1 is a partial, perspective view of a perovskite optical element of a preferred embodiment according to the present invention.

With reference to FIG. 1, a perovskite optical element of a preferred embodiment according to the present invention includes a light guiding element 1 and a luminescent layer 2. The luminescent layer 2 dads and surrounds the light guiding element 1.

The light guiding unit 1 may be obtained by cutting a section of a single crystal optical fiber (SCF) and removing a protective sheath thereof, such that the light guiding unit 1 is a column structure including a core and a cladding. The cross section of each of two ends of the light guiding unit 1 can be connected to a light source or an ordinary communication optical fiber. The light guiding unit 1 is configured to conduct light signals and provides the characteristics of a resonant cavity. Furthermore, an outer periphery of the light guiding unit 1 may preferably include an atomic-level flatness, such that nanomaterials can smoothly grow crystal on the surface of the single crystal optical fiber.

The luminescent layer 2 is a thin film made of perovskite material, such that the perovskite thin film can entirely clad the outer periphery of the light guiding unit 1 except the cross sections of the two ends of the light guiding member 1. The luminescent layer 2 can be excited by an external light source or voltage to emit light, and the light can be conducted by the light guiding unit 1. Alternatively, laser can be output after resonance in the light guiding unit 1. The wavelength of the light may be adjusted according to the ratio of halide of the perovskite material. In this embodiment, the perovskite material of the luminescent layer 2 is methylammonium lead iodide.

The perovskite optical element according to the present invention may further include a protective layer 3. The protective layer 3 covers an outer surface of the luminescent layer 2. This can prevent the water and oxygen in the environment from directly contacting with the luminescent layer 2, thereby avoiding shortening of the service life of the element resulting from deterioration of the perovskite material. Furthermore, due to the characteristic of the high thermal conductivity of the single crystal optical fiber of the light guiding unit 1, the luminescent layer 2 cladding the light guiding unit 1 can cool rapidly, solving the disadvantage of poor heat resistance of the perovskite material.

Figure 2:
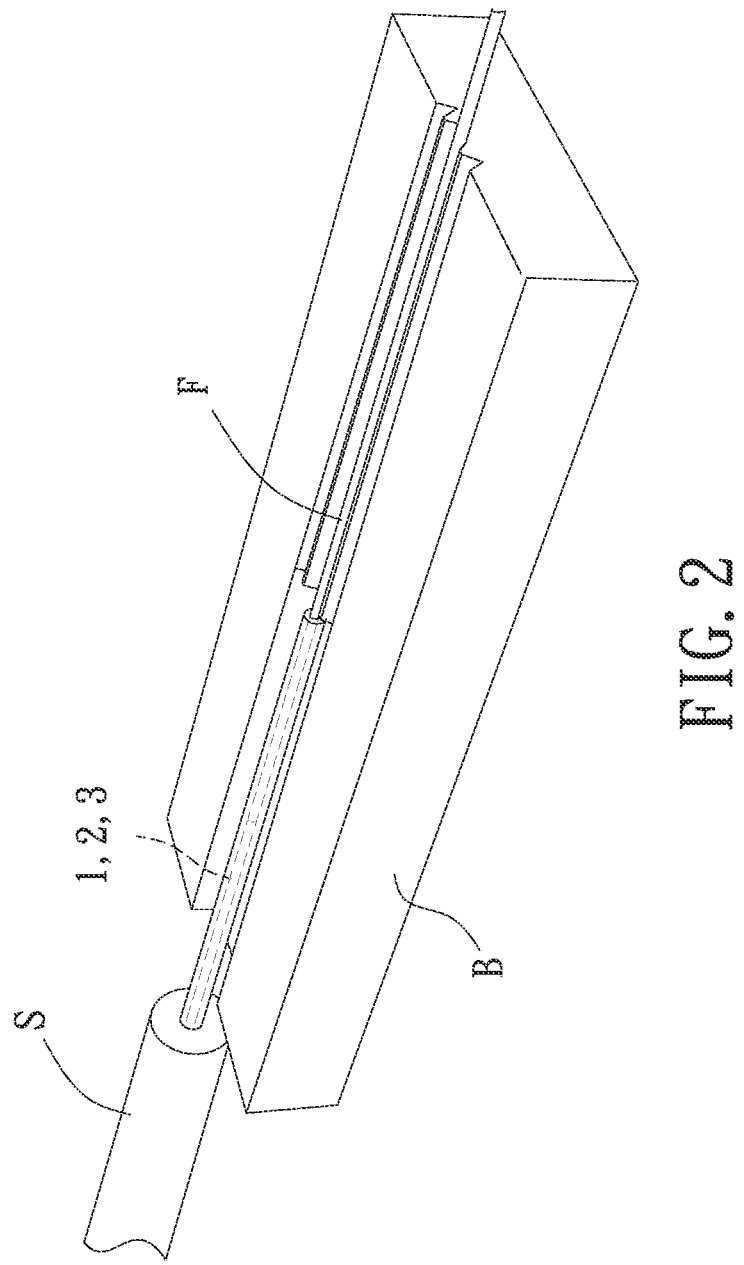
FIG. 2 is a diagrammatic view illustrating light-emitting operation of the perovskite optical element of the preferred embodiment according to the present invention.

With reference to FIG. 2 showing a device using the perovskite optical element according to the present invention for emitting light, the luminescent layer 2 is connected to an excitation module S. The excitation module S may be pulse laser which emits a laser light entering the luminescent layer 2, such that the perovskite material can generate photoluminescence. Furthermore, the incident angle of the laser light may be arbitrary. For example, the excitation module S may be located on a side of the light guiding unit 1, such that the laser enters the luminescent layer 2 in a path perpendicular to the light-conducting direction, saving the installation space of the excitation module S. The excitation module S may also be a voltage source. By electrically connecting the anode and the cathode of the voltage source with the luminescent layer 2, an electric field can act on the luminescent layer 2, such that the perovskite material generates photoluminescence. The anode and the cathode of the electric field are preferably located on two ends of the light guiding unit 1, such that the area of the luminescent layer 2 in the electric field can be maximized to increase the luminescence efficiency.

Furthermore, the light guiding unit 1 cladded by the luminescent layer 2 is fixed to a base B. The base B may be an optical fiber fixing device. After the core of the light guiding unit 1 is coupled and calibrated, the light guiding unit 1 is fixed by the base B to keep the optical path clear. An end of the light guiding unit 1 is aligned and coupled with a glass optical fiber F. Thus, after the light generated by the luminescent layer 2 is conducted or resonates in the light guiding unit 1, the light is output through the glass optical fiber F to an optical chip or other optical element, which can replace a diode laser to serve as a front light source for an integrated optical circuit.

Figure 3:
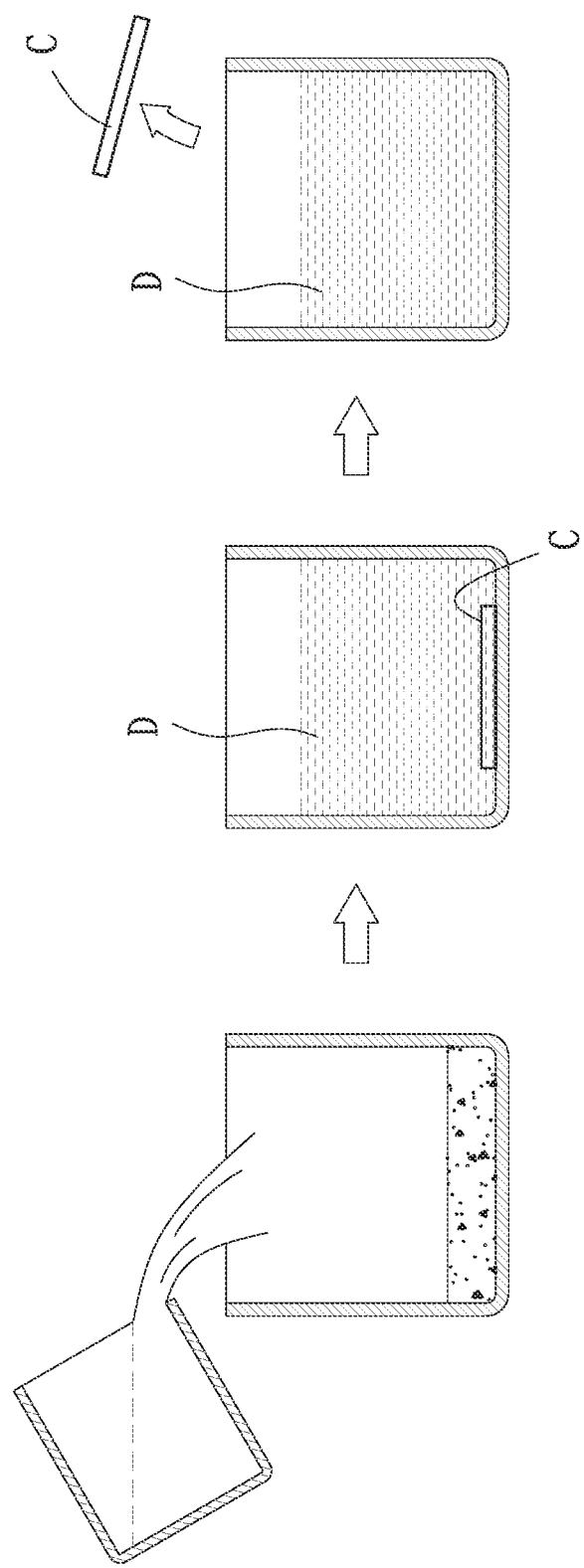
FIG. 3 is a diagrammatic view illustrating a dip coating procedure and a drying procedure of a manufacturing method of a preferred embodiment according to the present invention.
Figure 4:
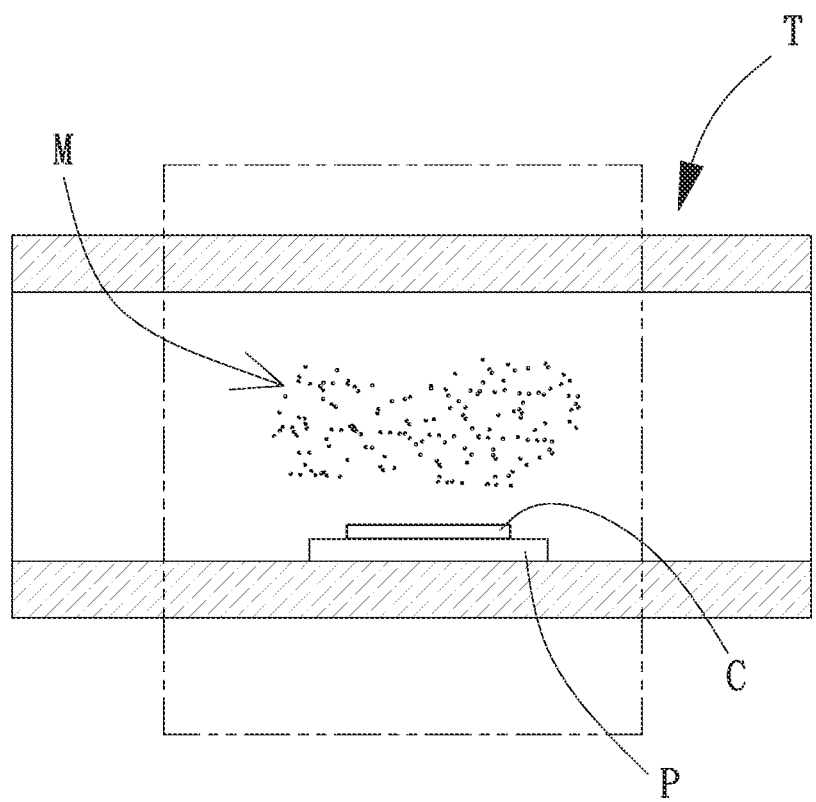
FIG. 4 is a diagrammatic view illustrating a synthetization procedure of the manufacturing method of the preferred embodiment according to the present invention.

FIGS. 3 and 4 show manufacturing steps of a manufacturing method of the perovskite optical element of a preferred embodiment according to the present invention. The manufacturing method includes preparing a dip coating solution D; dipping a single crystal optical fiber C in the dip coating solution D for one hour, removing the single crystal optical fiber C out of the dip coating solution D, and drying the single crystal optical fiber C; and placing the single crystal optical fiber C into a tube furnace T, heating the crystal optical fiber C, and introducing synthetic molecules M into the tube furnace T.

The dip coating solution D is obtained from dissolving lead iodide in dimethylformamide ($C_3H_7NO$, DMF). During the procedure of dipping the single crystal optical fiber C in the dip coating solution D and the procedure of drying the single crystal optical fiber C, lead iodide crystals are formed on an outer surface of the single crystal optical fiber C. The above procedures are carried out in a room temperature environment.

With reference to FIG. 4, two ends of the tube furnace T can be sealed and an intermediate portion of the tube furnace T is heated. An inert gas and the synthetic molecules M may be introduced into an interior space of the tube furnace T. The tube furnace T may further receive a platform P on which a to-be-processed workpiece is placed. In this embodiment, after the single crystal optical fiber C covered by lead iodide crystals is placed onto the platform P, the tube furnace T is evacuated to a pressure range of 0.01-5 Torr, and the tube furnace T is then gradually heated to a temperature range of 100-130° C. At the same time, the inert gas is filled into the tube furnace T to increase the pressure to 5-20 Torr, and the synthetic molecules M are added to proceed with reaction. During the reaction, the tube furnace T is maintained at the above temperature range of 100-130° C. and the above pressure range of 0.01-5 Torr for 1-5 hours. However, the present invention is not limited in this regard. The inert gas may be argon (Ar), and the synthetic molecules M are methylammonium iodide (CH3NH3I, MAI). The synthetic molecules M synthesize with the lead iodide on the single crystal optical fiber C to form a thin film of methylammonium lead iodide.

In view of the foregoing, in the perovskite optical element and the manufacturing method thereof according to the present invention, due to the characteristics of high thermal conductivity, photo conduction, and micro resonant cavity of the light guiding unit as well as the characteristics of the high luminescence efficiency and adjustable light wavelength of luminescent layer, the optical element produced can operate at normal temperature and can provide light of all bands. Furthermore, the perovskite optical element has a small volume and can be optionally and simply driven by electricity or light, thereby reducing the manufacturing complexity, reducing the consumed energy for driving, and being suitable for application in optical chips.

Although the invention has been described in detail with reference to its presently preferable embodiments, it will be understood by one of ordinary skill in the art that various modifications can be made without departing from the spirit and the scope of the invention, as set forth in the appended claims.

What is claimed is:

1. A manufacturing method of a perovskite optical element, comprising:
   providing a single crystal optical fiber having an outer periphery with a flatness in an atomic-level;
   dipping the single crystal optical fiber in a dip coating solution for one hour, removing the single crystal optical fiber out of the dip coating solution, and drying the single crystal optical fiber, wherein, during dipping the single crystal optical fiber in the dip coating solution, nanomaterials, provided in the dip coating solution, grow into crystals on the outer periphery of the single crystal optical fiber; and
   placing the single crystal optical fiber into a tube furnace, heating the single crystal optical fiber, and introducing synthetic molecules into the tube furnace to form the crystals into a perovskite thin film.

2. The manufacturing method of the perovskite optical element as claimed in claim 1, wherein the dip coating solution is obtained from dissolving lead iodide in dimethylformamide, wherein lead iodide crystals are formed an outer surface of the single crystal optical fiber, wherein the synthetic molecules are methylammonium iodide, and wherein the lead iodide crystals on the single crystal optical fiber synthesize with the synthetic molecules after heating, forming a thin film of methylammonium lead iodide.

3. The manufacturing method of the perovskite optical element as claimed in claim 1, wherein two ends of the tube furnace are sealed and an intermediate portion of the tube furnace is heated, and wherein an inert gas and the synthetic molecules are introduced into an interior space of the tube furnace.

4. The manufacturing method of the perovskite optical element as claimed in claim 3, wherein after the single crystal optical fiber is placed into the tube furnace, the tube furnace is evacuated to a pressure range of 0.01-5 Torr, and the tube furnace is then gradually heated to a temperature range of 100-130° C., wherein the inert gas is filled into the tube furnace simultaneously to increase the pressure to 5-20 Torr, wherein the synthetic molecules are added to proceed with a reaction, and during the reaction, the tube furnace is maintained at the temperature range of 100-130'C and the pressure range of 0.01-5 Torr for 1-5 hours.

* * * * *